(12) United States Patent
Lu

(10) Patent No.: US 9,366,787 B2
(45) Date of Patent: Jun. 14, 2016

(54) ORGANIC LIGHT EMITTING DIODE WITH LIGHT EXTRACTING LAYER

(71) Applicant: PPG Industries Ohio, Inc., Cleveland, OH (US)

(72) Inventor: Songwei Lu, Wexford, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 14/198,980

(22) Filed: Mar. 6, 2014

(65) Prior Publication Data

US 2014/0264416 A1 Sep. 18, 2014

Related U.S. Application Data

(60) Provisional application No. 61/777,207, filed on Mar. 12, 2013.

(51) Int. Cl.
*G02B 5/02* (2006.01)
*H01L 51/00* (2006.01)
*H01L 51/52* (2006.01)

(52) U.S. Cl.
CPC ............ *G02B 5/0242* (2013.01); *G02B 5/0268* (2013.01); *G02B 5/0278* (2013.01); *H01L 51/0096* (2013.01); *H01L 51/5268* (2013.01); *H01L 2251/5369* (2013.01); *Y02E 10/549* (2013.01); *Y02P 70/521* (2015.11); *Y10T 428/26* (2015.01); *Y10T 428/268* (2015.01)

(58) Field of Classification Search
None
See application file for complete search history.

(56) References Cited

U.S. PATENT DOCUMENTS

| | | | |
|---|---|---|---|
| 8,547,015 B2 * | 10/2013 | Wolk et al. | 313/512 |
| 8,754,434 B1 * | 6/2014 | Gollier et al. | 257/98 |
| 2005/0007000 A1 * | 1/2005 | Chou et al. | 313/116 |
| 2008/0032146 A1 | 2/2008 | Toyoshima et al. | |
| 2009/0015142 A1 * | 1/2009 | Potts et al. | 313/504 |
| 2010/0019664 A1 * | 1/2010 | Mishima | 313/504 |
| 2010/0150513 A1 * | 6/2010 | Zhang et al. | 385/131 |
| 2011/0284907 A1 * | 11/2011 | Nakamura et al. | 257/98 |
| 2012/0025245 A1 * | 2/2012 | Nakamura et al. | 257/98 |
| 2012/0092773 A1 | 4/2012 | Liu et al. | |
| 2012/0155093 A1 * | 6/2012 | Yamada et al. | 362/311.01 |
| 2012/0200929 A1 * | 8/2012 | Lu | 359/599 |
| 2012/0234460 A1 * | 9/2012 | Zhang et al. | 156/67 |
| 2013/0027641 A1 | 1/2013 | Kodama et al. | |
| 2013/0076235 A1 * | 3/2013 | Lee et al. | 313/504 |

FOREIGN PATENT DOCUMENTS

| | | |
|---|---|---|
| EP | 1 811 319 A1 | 7/2007 |
| TW | 201202752 A1 | 1/2012 |
| WO | 2012081442 A1 | 6/2012 |

OTHER PUBLICATIONS

PCT Search Report, PCT/US2014/021172, dated Jun. 5, 2014.
Espacenet English abstract of TW 201202752 A1.

* cited by examiner

*Primary Examiner* — Scott B Geyer
(74) *Attorney, Agent, or Firm* — Andrew C. Siminerio

(57) ABSTRACT

A light extraction substrate includes a glass substrate having a first surface and a second surface. A light extraction layer is formed on at least one of the surfaces. The light extraction layer is a coating, such as a silicon-containing coating, incorporating nanoparticles.

17 Claims, 2 Drawing Sheets

ORGANIC LIGHT EMITTING DIODE WITH LIGHT EXTRACTING LAYER

CROSS REFERENCE TO RELATED APPLICATION

This application claims priority to U.S. Provisional Application No. 61/777,207, filed Mar. 12, 2013, herein incorporated by reference in its entirety.

NOTICE OF GOVERNMENT SUPPORT

This invention was made with Government support under Contract No. DE-EE-0003209 awarded by the Department of Energy. The United States government may have certain rights in this invention.

BACKGROUND OF THE INVENTION

1. Field of the Invention

This invention relates generally to organic light emitting diodes, solar or photovoltaic (PV) cells, daylighting windows, and, more particularly, to a substrate having increased light scattering for improved light utilization.

2. Technical Considerations

An organic light emitting diode (OLED) is a light-emitting device having an emissive electroluminescent layer incorporating organic compounds. The organic compounds emit light in response to an electric current. Typically, an emissive layer of organic semiconductor material is situated between two electrodes (an anode and a cathode). When electric current is passed between the anode and the cathode, the organic material emits light. OLEDs are used in numerous applications, such as television screens, computer monitors, mobile phones, PDAs, watches, lighting, and various other electronic devices.

OLEDs provide numerous advantages over conventional inorganic devices, such as liquid crystal displays. For example, an OLED can function without the need for a back light. In low ambient light, such as a dark room, an OLED screen can achieve a higher contrast ratio than conventional liquid crystal displays. OLEDs typically are also thinner, lighter, and more flexible than liquid crystal displays and other lighting devices. OLEDs typically also require less energy to operate than many other conventional lighting devices.

However, one disadvantage with OLED devices is that they typically emit less light per unit area than inorganic solid-state based point-light sources. In a typical OLED lighting device, a large percentage of the light emitted from the organic material is trapped inside the device due to the optical waveguide effect in which the light from the organic emitting layer is reflected back from the interface of the organic emitting layer/conductive layer (anode), the interface of the conductive layer (anode)/substrate, and the outer surface/air interface. Only a relatively small percentage of the light emitted from the organic material escapes the optical waveguide effect and is emitted by the device. Therefore, it would be advantageous to provide a device and/or method to extract more light from an OLED device than is possible with conventional methods.

Photovoltaic solar cells are in principle counterparts to light emitting diodes. Here, the semiconductor material absorbs the energy of light (photons) and converts that energy into electricity. Similar to OLEDs, the efficiency of the photovoltaic device is relatively low. At the module level, for example, typically only up to 20% of the incident light is converted to electric energy. In one class of photovoltaic devices, those consisting of thin film PV cells, this efficiency can be much lower, depending on the semiconducting material and the junction design. One way to increase the efficiency of the photovoltaic device is to increase the fraction of the solar light that is absorbed near the photovoltaic semiconductor junction. Thus, the present invention also finds use in the field of solar cells.

SUMMARY OF THE INVENTION

A light extraction substrate comprises a substrate having a first surface and a second surface. The first surface can be an inner surface and the second surface can be an outer surface. The substrate can be a glass substrate or a polymeric substrate. The light extraction substrate further comprises a light extraction layer located over at least a portion of at least one of the surfaces. In a preferred embodiment, the light extraction layer is formed over the first surface, for example the inner surface. The light extraction layer comprises a coating with nanoparticles incorporated into the coating. The coating can be formed from a curable coating material having nanoparticles carried in, or incorporated, into the coating material. The coating material can be any material capable of having nanoparticles incorporated therein, such as for example, capable of having nanoparticles dissolved, suspended, or dispersed in the coating material. Examples of suitable coating materials include polymeric materials, polymeric organic materials, and mixtures thereof; thermosetting materials, thermoplastic materials, and mixtures thereof; silicon-containing coating materials, such as organosilicon-containing coating materials; silanes, siloxanes, and/or hydrolysates thereof; organosilanes; silyl substituted materials; and polymers derived from any such preceding such materials. Examples of such polymers include polysilanes, polyorganosilanes, polyorganosiloxanes, polyorganosilazanes, and polyorganosilazoxanes. One particular coating material is tris[3(trimethoxysilyl)propyl]isocyanate.

A method for making a light extraction substrate having a first surface and a second surface comprises forming a light extraction layer over at least a portion of at least one of the surfaces, for example the first surface. The light extraction layer is formed by adding nanoparticles to a coating material and then applying the nanoparticle-containing coating material onto the surface to form a coating with nanoparticles dispersed or suspended in the coating. The coating material can be applied by any conventional method, such as by spin coating, dip coating, brushing, or spraying. In a preferred embodiment, the coating is spin coated.

A light emitting device comprises a substrate, for example a glass substrate, having a first surface and a second surface. A light extraction layer is deposited, for example by spin deposition, over at least a portion of the first surface and/or the second surface. The light extraction layer comprises a coating having nanoparticles incorporated into the coating. An electrode, such as an anode, is located over at least a portion of the light extraction layer. A light emissive layer is located over at least a portion of the anode. Another electrode, such as a cathode, is located over at least a portion of the light emissive layer.

A method for making a light extracting substrate comprises mixing a nanoparticle-containing composition with a curable coating material to form a coating composition; spin coating the coating composition onto a surface of a glass substrate; and heating the coated glass substrate to cure the coating composition to form a light extraction layer having nanoparticles dispersed therein on the glass substrate surface. A light emitting device can be made using the further steps of providing an anode over at least a portion of the light extraction layer; providing a light emissive layer over at least a portion of the anode; and providing a cathode over at least a portion of the light emissive layer.

DESCRIPTION OF THE PREFERRED EMBODIMENTS

Figure 1:
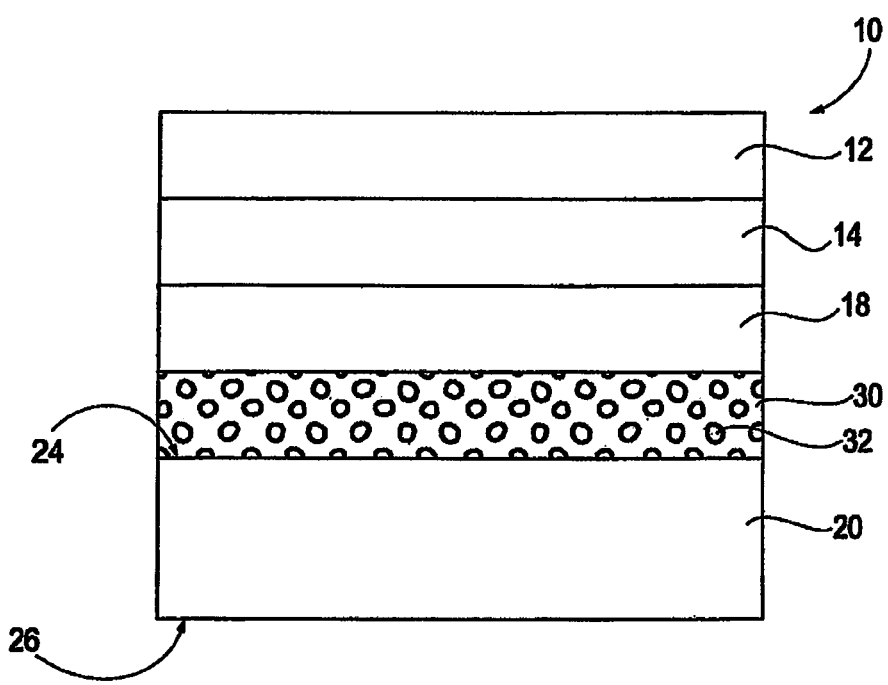
FIG. 1 is a side, sectional view (not to scale) of an OLED device incorporating a substrate of the invention.

As used herein, spatial or directional terms, such as "left", "right", "inner", "outer", "above", "below", and the like, relate to the invention as it is shown in the drawing figure. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Additionally, all documents, such as but not limited to, issued patents and patent applications, referred to herein are to be considered to be "incorporated by reference" in their entirety. Any reference to amounts, unless otherwise specified, is "by weight percent". The term "film" refers to a region of a coating having a desired or selected composition. A "layer" comprises one or more "films". A "coating" or "coating stack" is comprised of one or more "layers". By "curable" is meant that the composition is capable of polymerizing or crosslinking.

For purposes of the following discussion, the invention will be discussed with reference to a conventional OLED device. However, it is to be understood that the invention is not restricted to use with OLED devices but could be practiced in other fields, such as, but not limited to, photovoltaic thin film solar cells. For other uses, such as thin film solar cells, the glass architecture described later in this application might have to be modified.

An OLED device 10 incorporating features of the invention is shown in FIG. 1. The OLED device 10 includes an electrode, such as a cathode 12, an emissive layer 14, and another electrode, such as an anode 18. However, unlike conventional OLED devices, the OLED device 10 includes a substrate 20 incorporating features of the invention.

The structure and operation of a conventional OLED device will be well understood by one of ordinary skill in the art and, therefore, will not be described in detail. The cathode 12 can be any conventional OLED cathode. Examples of suitable cathodes include metals, such as but not limited to, barium and calcium. The cathode typically has a low work function.

The emissive layer 14 can be a conventional organic electroluminescent layer as known in the art. Examples of such materials include, but are not limited to, small molecules such as organometallic chelates (e.g., $Alq_3$), fluorescent and phosphorescent dyes, and conjugated dendrimers. Examples of suitable materials include triphenylamine, perylene, rubrene, and quinacridone. Alternatively, electroluminescent polymeric materials are also known. Examples of such conductive polymers include poly(p-phenylene vinylene) and polyfluorene. Phosphorescent materials could also be used. Examples of such materials include polymers such as poly(n-vinylcarbazole) in which an organometallic complex, such as an iridium complex, is added as a dopant.

The anode 18 can be a conductive, transparent material, such as a metal oxide material, such as, but not limited to, indium tin oxide (ITO) or aluminum-doped zinc oxide (AZO). The anode 18 typically has a high work function.

Unlike conventional OLED devices, the OLED device 10 is carried on a substrate 20 incorporating features of the invention. The substrate 20 is a transparent substrate having a first surface 24 and a second surface 26. In the illustrated example, the first surface 24 is an inner surface (i.e., the surface facing the interior of the OLED) and the second surface is an outer surface (i.e., the surface facing the exterior of the OLED). Examples of suitable materials for the substrate 20 include, but are not limited to, glass, such as conventional soda-lime silicate glass, for example, float glass and polymeric materials. The substrate 20 has a high visible light transmission at a reference wavelength of 550 nanometers (nm) and a reference thickness of 3.2 mm. By "high visible light transmission" it is meant visible light transmission at 550 nm of greater than or equal to 85%, such as greater than or equal to 87%, such as greater than or equal to 90%, such as greater than or equal to 91%, such as greater than or equal to 92%, such as greater than or equal to 93%, such as greater than or equal to 95%, at a 3.2 mm reference thickness. For example, the visible light transmission can be in the range of 85% to 100%, such as 87% to 100%, such as 90% to 100%, such as 91% to 100%, such as 92% to 100%, such as 93% to 100%, such as 94% to 100%, such as 95% to 100%, such as 96% to 100% at a 3.2 mm reference thickness and for a wavelength of 550 nm. Non-limiting examples of glass that can be used for the practice of the invention include, but are not limited to, Starphire, Solarphire®, Solarphire® PV, and CLEAR™ glass, all commercially available from PPG Industries, Inc. of Pittsburgh, Pa. Alternatively, the substrate 20 can be a polymeric substrate, such as an acrylic substrate.

The substrate 20 can have any desired thickness, such as in the range of 0.5 mm to 10 mm, such as 1 mm to 10 mm, such as 1 mm to 4 mm, such as 2 mm to 3.2 mm.

In the practice of the invention, the substrate 20 incorporates or has located thereon at least one light extraction layer 30 incorporating nanoparticles 32. Adding the light extraction layer 30 reduces the waveguide effect described above so that less light is reflected back from the various interfaces, and less light is trapped inside the device. This allows more light to be emitted from the device. The extraction layer 30 is formed by adding nanoparticles to a coating material and then applying the coating material onto at least one of the glass surfaces, such as the first surface 24 as shown in FIG. 1. Alternatively, the extraction layer 30 could be applied over the second surface 26. Or, an extraction layer 30 could be applied over both the first surface 24 and the second surface 26. In a preferred embodiment, the extraction layer 30 is located on the first surface 30. It is believed that placing the light extraction layer 30 on the inner surface (i.e., closer to the emissive layer 14) rather than the outer surface increases the overall light extraction of the device.

The coating material can be any material capable of having nanoparticles incorporated therein and capable of forming a coating. For example, the nanoparticles can be dissolved, dispersed, or suspended in the coating material. The coating can be formed from a curable coating material having nanoparticles incorporated into the coating material. Examples of suitable coating materials include polymeric materials, polymeric organic materials, and mixtures thereof; thermosetting materials, thermoplastic materials, and mixtures thereof; silicon-containing coating materials, such as organosilicon-containing coating materials; silanes, siloxanes, and/or hydrolysates thereof; organosilanes; silyl substituted materials; and polymers derived from any such preceding such materials. Examples of such polymers include polysilanes, polyorganosilanes, polyorganosiloxanes, polyorganosilazanes, and polyorganosilazoxanes. One particular coating material is tris[3(trimethoxysilyl)propyl]isocyanate. Examples of suitable coating materials include the Hi-Gard® coatings commercially available from PPG Industries, Inc.

It is preferred that the coating material form a coating (extraction layer 30) having a refractive index between the refractive index and the emissive layer 14 and the refractive index of the substrate 20 to help decrease the interference affect caused by the boundaries between the adjacent layers. For example, a glass substrate typically has a refractive index of about 1.5, such as in the range of 1.54 to 1.56. A conventional organic emissive layer typically has a refractive index in the range of 1.55 to 1.8, such as 1.6 to 1.8, such as about 1.7. Therefore, in this example, the light extraction layer 30 should have a refractive index between 1.5 and 1.7. Hi-Gard® 1600 (commercially available from PPG Industries, Inc.) has a refractive index of about 1.6, e.g., about 1.58.

Examples of suitable nanoparticles include, but are not limited to, oxide nanoparticles. Suitable nanoparticles include alumina, titania, cerium oxide, zinc oxide, tin oxide, silica, fumed silica, and zirconia.

The nanoparticles can be incorporated into the coating material in the range of 0.1 weight percent to 50 weight percent, such as 0.1 weight percent to 40 weight percent, such as 0.1 weight percent to 30 weight percent, such as 0.1 weight percent to 20 weight percent, such as 0.1 weight percent to 10 weight percent, such as 0.1 weight percent to 8 weight percent, such as 0.1 weight percent to 6 weight percent, such as 0.1 weight percent to 5 weight percent, such as 0.1 to 2 weight percent, such as 0.1 to 1 weight percent, such as 0.1 to 0.5 weight percent, such as 0.1 to 0.4 weight percent, such as 0.1 to 0.3 weight percent, such as 0.2 weight percent to 10 weight percent, such as 0.2 weight percent to 5 weight percent, such as 0.2 weight percent to 1 weight percent, such as 0.2 weight percent to 0.8 weight percent, such as 0.2 weight percent to 0.4 weight percent.

The light extraction layer 30 can have an average surface roughness ($R_a$), i.e., on the inner surface farthest from the glass substrate 20, in the range of 5 nm to 50 nm, such as 5 nm to 40 nm, such as 5 nm to 30 nm, such as 5 nm to 20 nm, such as less than 20 nm, such as less than 15 nm. The light extraction layer 30 can have a thickness in the range of 10 nm to 5,000 nm, such as 50 nm to 4,000 nm, such as 100 nm to 3,000 nm, such as 500 nm to 3,000 nm, such as 1,000 nm to 3,000 nm, such as 2,000 nm to 3,000 nm.

The light extraction layer 30 can provide the substrate 20 with haze in the range of 1% to 100%, such as 1% to 90%, such as 1% to 80%, such as 1% to 60%, such as 1% to 50%, such as 10% to 80%, such as 10% to 60%, such as 10% to 40%, as measured by a conventional Haze-Gard Plus hazemeter, commercially available from BYK-Gardner.

Operation of the OLED device 10 will now be described with particular reference to FIG. 1.

During operation, a voltage is applied across the anode 18 and the cathode 12. A current of electrons flows from the cathode 12 to the anode 18 through the emissive layer 14. This electric current causes the emissive layer 14 to emit light. The substrate 20 of the invention provides for increased light extraction as compared to an OLED device without the substrate 20. Electromagnetic radiation in the form of light waves emitted by the emissive layer 14 travels through the anode 18 into the substrate 20. These light waves encounter the light extraction layer 30 with the nanoparticles 32 and become more scattered, causing the light waves to travel more randomly through the substrate 20. The light scattering caused by the light extraction layer 30 increases the overall light extraction for the OLED device 10.

An example of a method for making a substrate 20 with a light extraction layer 30 is as follows. Nanoparticles or a nanoparticle-containing composition are added to a coating material. The nanoparticles and the coating material can be as described above. As a general rule, the higher the concentration of nanoparticles in the coating material, the higher will be the haze produced by the resultant coating. However, the nanoparticles should not be added to such an amount that the transmittance of the device becomes too low for its intended purpose. For example, typically the extraction layer 30 should not reduce the transmittance of the coated substrate 20 (i.e., the substrate 20 with the extraction layer 30) at a wavelength of 550 nm and a thickness of 3.2 mm to less than 90%, such as less than 88%, such as less than 87%, such as less than 85%, such as less than 80%, such as less than 75%, such as less than 70%, such as less than 65%, such as less than 60%, such as less than 50%. Typically, the nanoparticles can be added in the range of 0.1 weight percent to 10 weight percent based on the total weight of the coating material, such as 0.1 to 5 weight percent, such as 0.1 to 2 weight percent, such as 0.1 to 1 weight percent, such as 0.1 to 0.5 weight percent, such as 0.1 to 0.4 weight percent, such as 0.1 to 0.3 weight percent. The coating composition (coating material plus nanoparticles) is applied onto one or more of the substrate 20 surfaces. This can be done by any conventional method but in one preferred embodiment the coating composition is spin coated onto the substrate 20. The applied coating composition is then cured, such as by heating, drying, or UV curing, to form a coating (extraction layer 30) with the nanoparticles dispersed in the coating.

A light emitting device can be made using the further steps of providing an anode over at least a portion of the light extraction layer; providing a light emissive layer over at least a portion of the anode; and providing a cathode over at least a portion of the light emissive layer.

EXAMPLES

In the following Examples, the substrates were Solarphire® glass commercially available from PPG Industries Ohio, Inc. having a thickness of 2 millimeters (mm). The haze values are percentage values and were measured using a Haze-Gard Plus hazemeter commercially available from BYK-Gardner USA. The color coordinates are reported according to the standard CIELAB color system. The coating material (component A) was Hi-Gard® 1600 (commercially available from PPG Industries, Inc.) and component B was a ten percent aqueous solution of titania nanoparticles (commercially available from Aldrich Chemical Company).

Components A and B were mixed as in Table 1 below to form nanoparticle containing coating compositions 1-4. The values in Table 1 are weight percent based on the total weight of the composition. Since Component B was a ten weight percent solution of nanoparticles, a coating having 5 weight percent of component B (nanoparticles plus the aqueous solution) would have 0.5 weight percent nanoparticles.

TABLE 1

| Coating | Component A | Component B |
|---------|-------------|-------------|
| 1 | 95 | 5 |
| 2 | 90 | 10 |
| 3 | 80 | 20 |
| 4 | 60 | 40 |

The coating compositions 1-4 were spin coated onto glass substrates for 11 seconds at a coating speed of 1100 RPM. The coated glass samples were heated to 120 degrees Centigrade for three hours and then allowed to cool to room temperature. After cooling, the coated glass substrates had the color and haze values shown in Table 2.

TABLE 2

| Sample | Coating | L* | a* | b* | X | Y | Z | Haze |
|--------|---------|------|-------|-------|--------|--------|--------|-------|
| 1 | 1 | 94.516 | 0.013 | 1.699 | 81.996 | 86.478 | 90.349 | 9.49 |
| 2 | 2 | 92.821 | 0.197 | 2.934 | 78.372 | 82.558 | 84.511 | 20.58 |
| 3 | 3 | 89.953 | 0.505 | 4.654 | 72.488 | 76.202 | 75.689 | 38.86 |
| 4 | 4 | 85.5 | 1.048 | 7.411 | 63.973 | 66.993 | 63.145 | 63.2 |

Figure 2:
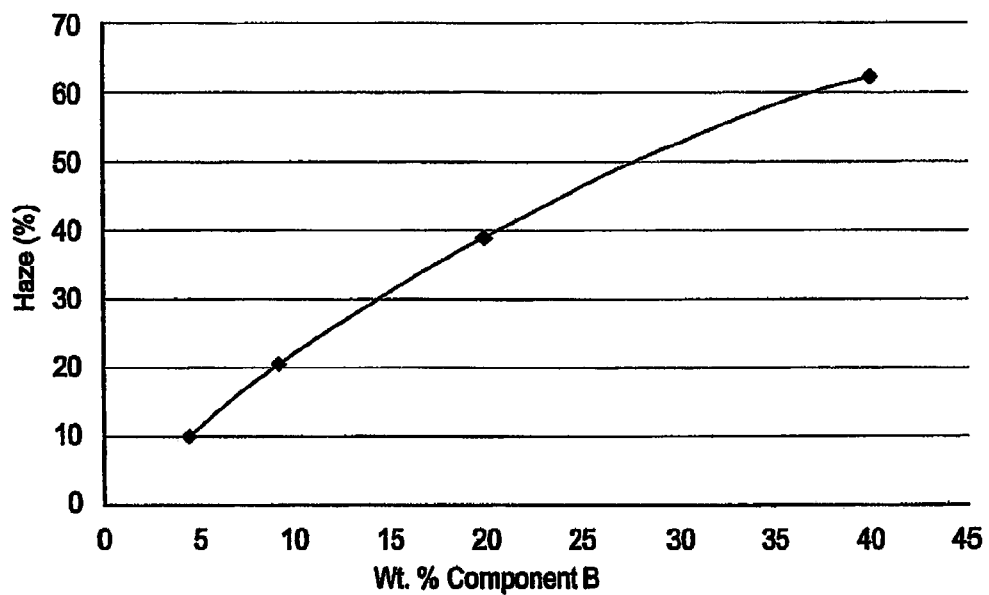
FIG. 2 is a graph of titania nanoparticle concentration versus haze for the coated glass Samples 1-4 of the Examples.

FIG. 2 shows the change in haze versus the nanoparticle content (amount of Component B). As can been seen, the addition of the light extraction layer of the invention to the glass substrate increased the haze (light scattering) of the substrate.

It will be readily appreciated by one of ordinary skill in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A light extraction substrate, comprising:
a substrate having a first surface and a second surface;
a light extraction layer over at least a portion of the first or second surface, the light extraction layer comprising a coating including nanoparticles,
wherein the light extraction layer has an average surface roughness in the range of 50 nanometers to 500 nanometers, and
wherein the substrate with the light extraction layer has haze in the range of 10% to 50%.

2. The light extraction substrate of claim 1, wherein the substrate comprises glass.

3. The light extraction substrate of claim 1, wherein the nanoparticles are selected from the group consisting of silver oxide, alumina, titania, cerium oxide, zinc oxide, tin oxide, silica, fumed silica, zirconia, and combinations thereof.

4. The light extraction substrate of claim 1, wherein the light extraction layer has a thickness in the range of 100 nm to 4,000 nm.

5. The light extraction substrate of claim 1, including an anode located on the light extraction layer.

6. The light extraction substrate of claim 5, wherein the light extraction layer has a refractive index between the refractive index of the anode and refractive index of the substrate.

7. The light extraction substrate of claim 1, wherein the coating comprises a silicon-containing coating material.

8. The substrate of claim 1, wherein the coating is a polymeric coating.

9. A light emitting device, comprising:
a glass substrate having a first surface and a second surface;
a light extraction layer spin deposited over at least a portion of the first surface, the light extraction layer comprising a silicon-containing coating including nanoparticles;
an anode over at least a portion of the light extraction layer;
a light emissive layer over at least a portion of the anode; and
a cathode over at least a portion of the light emissive layer,
wherein the light extraction layer has a refractive index between the refractive index of the anode and refractive index of the glass substrate, and
wherein the substrate with the light extraction layer has haze in the range of 10% to 50%.

10. The light emitting device of claim 9, wherein the light extraction layer is located between the substrate and the emissive layer.

11. The light emitting device of claim 9, wherein the light extraction layer is located between the substrate and the anode.

12. The light emitting device of claim 9, wherein the nanoparticles are selected from the group consisting of silver oxide, alumina, titania, cerium oxide, zinc oxide, tin oxide, silica, fumed silica, zirconia, and combinations thereof.

13. The light emitting device of claim 9, wherein the light extraction layer has a thickness in the range of 100 nm to 4,000 nm.

14. The light emitting device of claim 9, wherein the light extraction layer has an average surface roughness in the range of 50 nanometers to 500 nanometers.

15. A light emitting device comprising
a glass substrate having a first surface and a second surface;
a light extraction layer spin deposited over at least a portion of the first surface, the light extraction layer comprising a silicon-containing coating including nanoparticles;
an anode over at least a portion of the light extraction layer;
a light emissive layer over at least a portion of the anode; and
a cathode over at least a portion of the light emissive layer,
wherein the light extraction layer has an average surface roughness in the range of 50 nanometers to 500 nanometers, and
wherein the substrate with the light extraction layer has haze in the range of 10% to 50%.

16. A light emitting device comprising
a glass substrate having a first surface and a second surface;
a light extraction layer spin deposited over at least a portion of the first surface,
the light extraction layer comprising a silicon-containing coating including nanoparticles;
an anode over at least a portion of the light extraction layer;

a light emissive layer over at least a portion of the anode; and a cathode over at least a portion of the light emissive layer, wherein the coating comprises a polymeric organosilane material.

17. A light extraction substrate, comprising:

a substrate having a first surface and a second surface;

a light extraction layer over at least a portion of the first or second surface, the light extraction layer comprising a coating including nanoparticles; and an anode located on the light extraction layer, wherein the light extraction layer has a refractive index between the refractive index of the anode and refractive index of the substrate, and wherein the substrate with the light extraction layer has haze in the range of 10% to 50%.

* * * * *